(12) United States Patent
Sun (10) Patent No.: US 11,877,472 B2
(45) Date of Patent: Jan. 16, 2024

(54) ORGANIC LIGHT-EMITTING DIODE DISPLAY PANEL HAVING COUPLING LAYER WITH DIFFERENT THICKNESSES AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Jiajia Sun, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 679 days.

(21) Appl. No.: 16/980,036

(22) PCT Filed: Jul. 24, 2020

(86) PCT No.: PCT/CN2020/104022
§ 371 (c)(1),
(2) Date: Sep. 11, 2020

(87) PCT Pub. No.: WO2022/000639
PCT Pub. Date: Jan. 6, 2022

(65) Prior Publication Data
US 2023/0098776 A1 Mar. 30, 2023

(30) Foreign Application Priority Data
Jul. 3, 2020 (CN) .......................... 202010631559.X (51) Int. Cl.
*H10K 50/852* (2023.01)
*H10K 71/00* (2023.01)
*H10K 102/00* (2023.01)

(52) U.S. Cl.
CPC ........... *H10K 50/852* (2023.02); *H10K 71/00* (2023.02); *H10K 2102/351* (2023.02)

(58) Field of Classification Search
CPC .................. H10K 50/852; H10K 71/00; H10K 2102/351; H10K 59/12; H10K 59/876;
(Continued)

(56) References Cited

U.S. PATENT DOCUMENTS 8,421,097 B2 * 4/2013 Jeong ..................... H10K 59/35
257/89
8,884,316 B2 * 11/2014 Weaver .................. H10K 50/85
257/89

(Continued)

FOREIGN PATENT DOCUMENTS

CN 103000824 A 3/2013
CN 105280838 A 1/2016
(Continued)

*Primary Examiner* — Caleb E Henry (57) ABSTRACT

An organic light-emitting diode (OLED) display panel and a display device are provided. The OLED display panel includes a substrate, a driving circuit layer, a luminous functional layer, a first coupling layer, and a second coupling layer. The second coupling layer includes a first coupling portion, a second coupling portion, and a third coupling portion respectively corresponding to red, green, and blue pixels. A thickness of the first coupling portion is greater than or equal to a thickness of the second coupling portion, and greater than a thickness of the third coupling portion. The thickness of the second coupling portion is greater than or equal to the thickness of the third coupling portion.

18 Claims, 2 Drawing Sheets

(58) Field of Classification Search
CPC ........ H10K 59/35; H10K 50/84; H10K 50/85; H10K 50/86; H01L 27/1214; H01L 51/5281; H01L 51/5237; H01L 51/5262; H01L 27/3211
See application file for complete search history.

(56) References Cited

U.S. PATENT DOCUMENTS

| | | | | |
|---|---|---|---|---|
| 8,957,579 | B2* | 2/2015 | Weaver | H10K 59/351 |
| | | | | 313/506 |
| 10,256,438 | B2* | 4/2019 | Kim | H10K 59/35 |
| 10,333,091 | B2* | 6/2019 | Uesaka | H10K 50/17 |
| 10,510,807 | B2* | 12/2019 | Tsukamoto | C09K 11/06 |
| 10,680,039 | B2* | 6/2020 | Tsukamoto | H10K 71/00 |
| 11,367,753 | B2* | 6/2022 | Oh | H10K 59/353 |
| 2011/0084291 | A1* | 4/2011 | Jeong | H10K 50/841 |
| | | | | 257/89 |
| 2012/0319145 | A1* | 12/2012 | Weaver | H10K 59/30 |
| | | | | 257/E33.056 |
| 2014/0034919 | A1 | 2/2014 | Park et al. | |
| 2015/0021582 | A1* | 1/2015 | Weaver | H10K 50/86 |
| | | | | 257/40 |
| 2017/0186971 | A1* | 6/2017 | Kanamoto | C09K 11/06 |
| 2017/0324054 | A1* | 11/2017 | Ishisone | H10K 50/121 |
| 2018/0122874 | A1* | 5/2018 | Kim | H10K 59/38 |
| 2018/0180951 | A1* | 6/2018 | Toyotaka | H10K 59/173 |
| 2018/0182817 | A1* | 6/2018 | Jo | G06F 3/0412 |
| 2019/0305246 | A1* | 10/2019 | Helander | H10K 50/828 |
| 2020/0119310 | A1* | 4/2020 | Huh | H10K 59/50 |
| 2020/0194676 | A1* | 6/2020 | Chang | H10K 59/12 |
| 2020/0411489 | A1* | 12/2020 | Ahmed | H01L 33/42 |
| 2021/0005844 | A1* | 1/2021 | Kim | H10K 59/12 |
| 2022/0416210 | A1* | 12/2022 | Kim | H10K 50/852 |

FOREIGN PATENT DOCUMENTS

| | | |
|---|---|---|
| CN | 107154415 A | 9/2017 |
| CN | 107808934 A | 3/2018 |
| CN | 108417584 A | 8/2018 |
| CN | 109686864 A | 4/2019 |
| CN | 110212109 A | 9/2019 |
| CN | 111129359 A | 5/2020 |

* cited by examiner

FIG. 1

(PRIOR ART)

ORGANIC LIGHT-EMITTING DIODE DISPLAY PANEL HAVING COUPLING LAYER WITH DIFFERENT THICKNESSES AND DISPLAY DEVICE

FIELD OF DISCLOSURE

The present disclosure relates to the field of displays, and in particular to an organic light-emitting diode (OLED) display panel and a display device.

BACKGROUND

OLED devices are regarded as a next generation of new display technology due to their light weight, wide viewing angles, fast response times, low temperature resistance, and high luminous efficiency.

Figure 1:
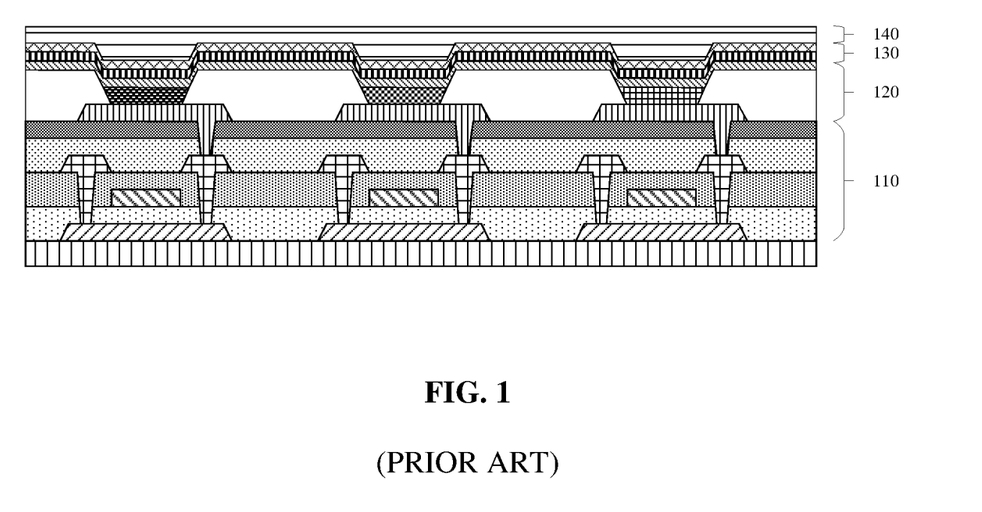
FIG. 1 is a schematic diagram of a structure of an OLED display panel in the prior art.

As shown in FIG. 1, which is a schematic diagram of a structure of a existing OLED display panel, which mainly includes a driving circuit layer 110, a luminous functional layer 120, a light coupling layer 130, and an encapsulation layer 140. In the existing OLED display panel, the light coupling layer 130 is formed by a single process, and its thickness keeps the same, and it is impossible to achieve a best light luminous efficiency for three colors of red, green, and blue at the same time.

Therefore, it is necessary to solve the problem of poor luminous efficiency in the existing OLED display panel.

SUMMARY OF DISCLOSURE

The present disclosure provides an OLED display panel and a display device to improve the problem of poor luminous efficiency in the existing OLED display panel.

The present disclosure provides an OLED display panel, including:

a substrate;

a driving circuit layer disposed on the substrate;

a luminous functional layer disposed on the driving circuit layer and including a red-light material layer, a green-light material layer, and a blue-light material layer;

a light coupling layer disposed on the luminous functional layer and including a first coupling layer and a second coupling layer, where the second coupling layer is disposed on a side of the first coupling layer away from the luminous functional layer; and an encapsulation layer disposed on the light coupling layer.

The second coupling layer includes a first coupling portion, a second coupling portion, and a third coupling portion, the first coupling portion is disposed above the red-light material layer, the second coupling portion is disposed above the green-light material layer, the third coupling portion is disposed above the blue-light material layer, a thickness of the first coupling portion is greater than or equal to a thickness of the second coupling portion, the thickness of the second coupling portion is greater than or equal to a thickness of the third coupling portion, and the thickness of the first coupling portion is greater than the thickness of the third coupling portion.

In the OLED display panel of the present disclosure, the thickness of the first coupling portion ranges from 120 to 150 nanometers.

In the OLED display panel of the present disclosure, the thickness of the second coupling portion ranges from 80 to 90 nanometers.

In the OLED display panel of the present disclosure, the thickness of the third coupling portion ranges from 40 to 60 nanometers.

In the OLED display panel of the present disclosure, a refractive index of the second coupling layer is less than a refractive index of the first coupling layer.

In the OLED display panel of the present disclosure, the refractive index of the second coupling layer ranges from 1.3 to 1.8.

In the OLED display panel of the present disclosure, material of the second coupling layer includes an inorganic material.

In the OLED display panel of the present disclosure, the material of the second coupling layer is selected from a group consisting of lithium fluoride, magnesium fluoride, yttrium fluoride, ytterbium fluoride, calcium fluoride, aluminum fluoride, barium fluoride, sodium fluoride, silicon monoxide, yttrium oxide, aluminum oxide, magnesium oxide, hafnium dioxide, and lead fluoride.

In the OLED display panel of the present disclosure, each of the first coupling portion, the second coupling portion, and the third coupling portion include a first coupling sub-layer, and the first coupling sub-layer is disposed on the side of the first coupling layer away from the luminous functional layer. Each of the first coupling portion and the second coupling portion further include a second coupling sub-layer, and the second coupling sub-layer is disposed on a side of the first coupling sub-layer away from the first coupling layer.

In the OLED display panel of the present disclosure, the first coupling portion further includes a third coupling sub-layer, and the third coupling sub-layer is disposed on a side of the second coupling sub-layer away from the first coupling sub-layer.

Moreover, the present disclosure also provides a display device, including an organic light-emitting diode (OLED) display panel. The OLED display panel includes:

a substrate;

a driving circuit layer disposed on the substrate;

a luminous functional layer disposed on the driving circuit layer and including a red-light material layer, a green-light material layer, and a blue-light material layer;

a light coupling layer disposed on the luminous functional layer and including a first coupling layer and a second coupling layer, where the second coupling layer is disposed on a side of the first coupling layer away from the luminous functional layer; and an encapsulation layer disposed on the light coupling layer.

The second coupling layer includes a first coupling portion, a second coupling portion, and a third coupling portion, the first coupling portion is disposed above the red-light material layer, the second coupling portion is disposed above the green-light material layer, the third coupling portion is disposed above the blue-light material layer, a thickness of the first coupling portion is greater than or equal to a thickness of the second coupling portion, the thickness of the second coupling portion is greater than or equal to a thickness of the third coupling portion, and the thickness of the first coupling portion is greater than the thickness of the third coupling portion.

In the display device of the present disclosure, the thickness of the first coupling portion ranges from 120 to 150 nanometers.

In the display device of the present disclosure, the thickness of the second coupling portion ranges from 80 to 90 nanometers.

In the display device of the present disclosure, the thickness of the third coupling portion ranges from 40 to 60 nanometers.

In the display device of the present disclosure, a refractive index of the second coupling layer is less than a refractive index of the first coupling layer.

In the display device of the present disclosure, the refractive index of the second coupling layer ranges from 1.3 to 1.8.

In the display device of the present disclosure, material of the second coupling layer includes an inorganic material.

In the display device of the present disclosure, the material of the second coupling layer is selected from a group consisting of lithium fluoride, magnesium fluoride, yttrium fluoride, ytterbium fluoride, calcium fluoride, aluminum fluoride, barium fluoride, sodium fluoride, silicon monoxide, yttrium oxide, aluminum oxide, magnesium oxide, hafnium dioxide, and lead fluoride.

In the display device of the present disclosure, each of the first coupling portion, the second coupling portion, and the third coupling portion include a first coupling sub-layer, and the first coupling sub-layer is disposed on the side of the first coupling layer away from the luminous functional layer. Each of the first coupling portion and the second coupling portion further include a second coupling sub-layer, and the second coupling sub-layer is disposed on a side of the first coupling sub-layer away from the first coupling layer.

In the display device of the present disclosure, the first coupling portion further includes a third coupling sub-layer, and the third coupling sub-layer is disposed on a side of the second coupling sub-layer away from the first coupling sub-layer.

The present disclosure provides an OLED display panel and a display device. The OLED display panel includes a substrate, a driving circuit layer, a luminous functional layer, a light coupling layer, and an encapsulation layer. The driving circuit layer is disposed on the substrate. The luminous functional layer is disposed on the driving circuit layer and includes a red-light material layer, a green-light material layer, and a blue-light material layer. The light coupling layer is disposed on the luminous functional layer and includes a first coupling layer and a second coupling layer. The second coupling layer is disposed on a side of the first coupling layer away from the luminous functional layer. The encapsulation layer is disposed on the light coupling layer. The second coupling layer includes a first coupling portion, a second coupling portion, and a third coupling portion. The first coupling portion is disposed above the red-light material layer. The second coupling portion is disposed above the green-light material layer. The third coupling portion is disposed above the blue-light material layer. A thickness of the first coupling portion is greater than or equal to a thickness of the second coupling portion. The thickness of the second coupling portion is greater than or equal to a thickness of the third coupling portion. The thickness of the first coupling portion is greater than the thickness of the third coupling portion. Thus, in the OLED display panel, the best luminous efficiency of at least two different lights is achieved at the same time, which improves an overall luminous efficiency of the OLED display panel and improves a display performance of the OLED display panel.

BRIEF DESCRIPTION OF DRAWINGS

In the following, with reference to the accompanying drawings, the technical solutions and other beneficial effects of the present disclosure will be made obvious by describing in detail the specific embodiments of the present disclosure.

DETAILED DESCRIPTION

In view of the poor luminous efficiency of the existing OLED display panel, the present disclosure provides an OLED display panel to solve this problem.

Figure 2:
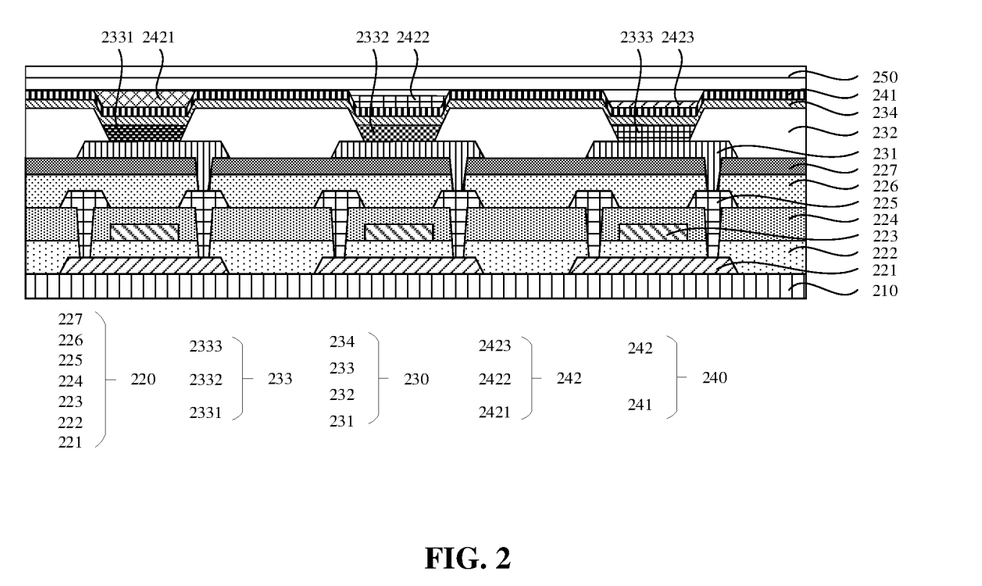
FIG. 2 is a schematic diagram of a structure of an OLED display panel of an embodiment of the present disclosure.

In an embodiment, referring to FIG. 2, an OLED display panel of an embodiment of the present disclosure includes:
a substrate 210;
a driving circuit layer 220 disposed on substrate 210;
a luminous functional layer 230 disposed on the driving circuit layer 220 and including a red-light material layer 2331, a green-light material layer 2332, and a blue-light material layer 2333;
a light coupling layer 240 disposed on the luminous functional layer 230 and including a first coupling layer 241 and a second coupling layer 242, where the second coupling layer 242 is disposed on a side of the first coupling layer 241 away from the luminous functional layer 230;
an encapsulation layer 250 disposed on the light coupling layer 240.

The second coupling layer 242 includes a first coupling portion 2421, a second coupling portion 2422, and a third coupling portion 2423, the first coupling portion 2421 is disposed above the red-light material layer 221, the second coupling portion 2422 is disposed above the green-light material layer 222, the third coupling portion 2423 is disposed above the blue-light material layer 233, a thickness of the first coupling portion 2421 is greater than or equal to a thickness of the second coupling portion 2422, the thickness of the second coupling portion 2422 is greater than or equal to a thickness of the third coupling portion 2423, and the thickness of the first coupling portion 2421 is greater than the thickness of the third coupling portion 2423.

The embodiment of the present disclosure provides the OLED display panel. The OLED display panel includes the first coupling portion, the second coupling portion, and the third coupling portion disposed on the luminous functional layer and corresponding to the red-light material layer, the green-light material layer, and the blue-light material layer, respectively. Moreover, the thickness of the first coupling portion is greater than or equal to the thickness of the second coupling portion, the thickness of the second coupling portion is greater than or equal to the thickness of the third coupling portion, and the thickness of the first coupling portion is greater than the thickness of the third coupling portion. Thus, in the OLED display panel, the best luminous efficiency of at least two different lights is achieved at the same time, which improves an overall luminous efficiency of the OLED display panel and improves the display performance of the OLED display panel.

The substrate 210 generally includes a rigid substrate and a flexible substrate. The rigid substrate is generally a glass substrate, and its material includes a silicate material. The flexible substrate usually includes a first organic substrate, an inorganic substrate, and a second inorganic substrate. Materials of the first organic substrate and the second organic substrate are usually organic polymer materials, such as polyacetamide and polyethylene terephthalate, which are used to realize a flexible performance of the display panel. Material of the inorganic substrate is generally silicon oxide or silicon nitride, which is used to maintain rigidity and support performance of the substrate.

The driving circuit layer 220 is disposed on the substrate 210. The driving circuit layer 220 includes thin film transistors and metal wires arranged in an array, and the thin film transistors and the metal wires in the driving circuit layer 220 together constitute a driving circuit of the OLED display panel, which is configured to drive the luminous functional layer 230 for luminous image display. The driving circuit layer 220 includes a semiconductor active layer 221, a first insulating layer 222, a gate metal layer 223, a second insulating layer 224, a source/drain layer 225, a passivation layer 226, and a planarization layer 227 sequentially disposed on the substrate 210. The semiconductor active layer 221 is patterned to form a channel of the thin film transistor. Material of the semiconductor active layer 221 may be an oxide semiconductor material, such as indium gallium zinc oxide, indium tin oxide, indium zinc oxide, etc., or may be a polycrystalline silicon material or a single crystal silicon material. The gate metal layer 223 is patterned to form a gate of the thin film transistor and a gate scan line. Material of the gate metal layer 223 may be metallic molybdenum, aluminum, copper, titanium, chromium, silver, or a mixture thereof. The gate metal layer 223 may have a single film structure, such as a single layer of metallic copper, a single layer of metallic aluminum, and a single layer of metallic copper, etc. It can also be a double-layer structure, such as an aluminum/molybdenum laminate structure, an aluminum/titanium laminate structure, and a copper/titanium laminate structure. It can also be a three-layer structure, such as a molybdenum/aluminum/molybdenum laminate structure, a titanium/aluminum/titanium laminate structure, a titanium/copper/titanium laminate structure, etc., which are not specifically limited herein. The source/drain layer 225 is patterned to form a source and a drain of the thin film transistor, a data line, and a power line. Material of the source/drain layer 225 is similar to that of the gate layer. The first insulating layer 222, the second insulating layer 224, and the passivation layer 226 are configured to isolate the metal layer, and materials thereof include inorganic materials, organic materials, or other suitable materials. The inorganic material includes, but are not limited to, silicon oxide, silicon nitride, and silicon oxynitride. The organic material includes, but are not limited to, polyimide resins, epoxy resins, acrylic resins, and tetrafluoroethylene-perfluoroalkoxy vinyl ether copolymers. The planarization layer 227 is configured to planarize the driving circuit layer 220 and provide a flat substrate for the formation of the luminous functional layer 230. The planarization layer 227 is generally made of an organic material.

The luminous functional layer 230 includes a pixel electrode layer 231, a pixel definition layer 232, a luminescent material layer 233, and a common electrode layer 234. The pixel electrode layer 231 is formed on the planarization layer 227 and patterned to form pixel electrodes to provide driving electrical signals to the light-emitting material layer 233. The pixel definition layer 232 is formed on the pixel electrode layer 231 and patterned to form a pixel area. The luminescent material layer 232 is formed in the pixel area of the pixel definition layer, and is used for luminous display according to different luminescent materials under the driving of the driving circuit. The common electrode layer 234 is entirely disposed on the pixel definition layer 232 and the light-emitting material layer 233, and is configured to provide common electrical signals to the light-emitting material layer 233.

The luminescent material layer 233 is configured to make the OLED display panel emit light and display, and it includes a hole transport layer, an electron transport layer, and a luminous layer located between the hole transport layer and the electron transport layer. The hole transport layer is disposed between the pixel electrode layer 231 and the light-emitting layer. The electron transport layer is disposed between the common electrode layer 234 and the luminous layer. In order to improve an efficiency of injecting electrons and holes into the light-emitting material layer, the light-emitting material layer 233 may further include an electron injection layer and a hole injection layer. The electron injection layer is disposed between the common electrode layer 234 and the electron transport layer, and the hole injection layer is disposed between the hole transport layer and the pixel electrode layer 231.

The hole transport layer is made of materials with high hole mobility, high thermal stability, and good electron and exciton blocking ability. The materials of the hole transport layer is generally selected from the group consisting of 4,4',4"-Tris[2-naphthyl(phenyl)amino] triphenylamine (2TNATA), N'-bis(phenyl)benzidine (NPB), and 1,1-bis[di-4-tolylamino)phenyl]cyclohexane (TAPC). A thickness of the hole transport layer generally ranges from 40-150 nm. The electron transport layer is made of materials with high electron mobility, high thermal stability, and good hole and exciton blocking ability. The materials of the electron transport layer is selected from the group consisting of 1,3,5-tri (phenyl-2-benzimidazole)benzene (TPBi), Bathophenanthroline (BPhen), and 1,3,5-Tris(3-pyridyl-3-phenyl) benzene (TmPyPB). A thickness of the electron transport layer generally ranges from 20-80 nm.

The light-emitting layer is made of an organic semiconductor light-emitting material, including red, green, and blue light-emitting molecules. The light-emitting material layer composed of the red light-emitting layer is a red-light material layer 2331. The light-emitting material layer composed of the green light-emitting layer is a green-light material layer 2332. The light-emitting material layer composed of the blue light-emitting layer is blue-light material layer 2333.

When a working voltage is applied to the pixel electrode 231 and the common electrode 234, the holes in the pixel electrode 231 and the electrons in the common electrode 234 are injected into the luminescent material layer. Holes and electrons are meet in the luminescent material layer, and the two will combine together to form electron-hole pairs and release energy. The energy is emitted in a form of light, which passes through different light-emitting molecules in the luminous material layer 233 and then displays light of different colors, and the light is uniformly emitted from both sides of the luminous functional layer.

Accordingly, the light emitted by the luminescent material layer 233 is a bidirectional light, that is, the light can be emitted from above and below the luminescent material layer 233. In the process of light transmission, if it is not blocked, the light can be directly emitted from the display panel. If the light is blocked by, for example, an electrode of an opaque material, the light will be reflected back by the electrode of the opaque material and emitted from the other direction of the OLED display panel. Therefore, according to the different materials of the pixel electrode 231 and the common electrode 234, the OLED display panel can be divided into a single-sided light-emitting display panel and a double-sided light-emitting display panel. If the material of one of the pixel electrode 231 and the common electrode 234 is an opaque conductive material, the display panel is the single-side light-emitting display panel. If the material of the pixel electrode 231 and the common electrode 234 are both a light-transmitting conductive material, the display panel is the double-sided light-emitting display panel.

The opaque conductive material includes one or more of ytterbium (Yb), calcium (Ca), magnesium (Mg), and silver (Ag). The light-transmitting conductive material includes indium tin oxide (ITO), indium zinc oxide (IZO), aluminum tin oxide (ATO), aluminum zinc oxide (AZO), indium gallium zinc oxide (IGZO), and a transparent conductive material, such as metals or alloys, whose thickness is less than 60 angstroms.

The pixel electrode 231, the common electrode 234, and the luminescent material layer 233 together form an optical microcavity. The optical microcavity refers to an optical micro-resonator whose cavity size is as small as that of resonant light waves in at least one direction. The light emitted by the luminescent material layer 233 will cause interference in the microcavity at different angles and positions. By setting an optical microcavity with a certain cavity length, it is possible to selectively enhance the light of a certain wavelength range while weakening the light of other wavelength ranges, so as to improve the light coupling. The cavity length of the optical microcavity can be adjusted according to different structures. By selecting a suitable cavity length, the luminous efficiency of the OLED device can be enhanced due to the interference.

The light coupling layer 240 is disposed above the luminescent material layer 233 and between the luminous functional layer 230 and the encapsulation layer 250. The light coupling layer 240 can function together with the optical microcavity structure formed in the luminous functional layer 230 to improve the light extraction efficiency. The light coupling layer 240 includes a first coupling layer 241 and a second coupling layer 242. The second coupling layer 242 is disposed on a side of the first coupling layer 241 away from the luminous functional layer 230. A refractive index of the first coupling layer 241 is greater than a refractive index of the second coupling layer 242.

The refractive index of the first coupling layer 241 is greater than 1.8. The light-emitting material layer 233 is made of an organic material. A refractive index of the organic material is approximately 1.6 to 1.7. The common electrode layer 234 is an extremely thin metal material layer, and its refractive index is approximately 1.8 to 2.0. The refractive index of the first coupling layer 241 is greater than a refractive index of the common electrode layer 234. The first coupling layer 241 having high refractive index enhances a relative interference performance of light in the microcavity. The luminous efficiency of the OLED display panel is improved due to interference enhancement. The first coupling layer 241 may be an organic coupling layer. Material of the organic coupling layer includes at least one of tris(8-quinolinolato) aluminum ($AlQ_3$), aromatic amine compounds, and anthracene compounds. It may also be an inorganic coupling layer. The inorganic coupling layer is made of one or more high refractive index material including tantalum pentoxide ($Ta_2O_5$), titanium dioxide ($TiO_2$), zirconium dioxide ($ZrO_2$), tin oxide ($SnO_2$), cerium dioxide ($CeO_2$), niobium pentoxide ($Nb_2O_5$), chromium oxide ($Cr_2O_3$), zinc selenide (ZnSe), zinc sulfide (ZnS), barium sulfide (BaS), gadolinium oxide ($Gd_2O_3$), barium titanate ($BaTiO_3$), calcium oxide (CaO), boron nitride (BN), zinc germanium (ZnGe). A thickness of the first coupling layer 241 ranges from 30 to 120 nanometers.

The encapsulation layer 250 generally includes a first inorganic layer, a second inorganic layer, and an organic layer disposed between the first inorganic layer and the second inorganic layer. Material of the organic layer usually includes polyacetamide, polyethylene terephthalate, and other organic polymer materials, which are configured to improve the flexibility of the OLED display panel. Materials of the first inorganic layer and the second inorganic layer include, but are not limited to, silicon oxide, silicon nitride, or silicon oxynitride, which are configured to isolate the water and oxygen outside the OLED display panel and improve a mechanical performance of the OLED display panel.

A refractive index of the second coupling layer 242 ranges from 1.3 to 1.8, and the second coupling layer 242 is made of an inorganic material, including one or more of lithium fluoride (LiF), magnesium fluoride ($MgF_2$), yttrium fluoride ($YF_3$), ytterbium fluoride ($YbF_3$), calcium fluoride ($CaF_2$), aluminum fluoride ($AlF_3$), barium fluoride ($BaF_2$), sodium fluoride (NaF), silicon monoxide (SiO), yttrium oxide ($Y_2O_3$), aluminum oxide ($Al_2O_3$), magnesium oxide (MgO), hafnium dioxide ($HfO_2$), and lead fluoride ($PbF_2$). Refractive indexes of the first inorganic layer and the second inorganic layer are less than the refractive index of the first coupling layer 241, and generally range from 1.0 to 1.3. The light is emitted from an optically denser medium into an optically thinner medium, and a phenomenon of total reflection occurs. The refractive index of the second coupling layer 242 is greater than a refractive index of the encapsulation layer 250 and less than the refractive index of the first coupling layer 241, so the light is excessive, a total reflection of the light in the light coupling layer 240 at the encapsulation layer 250 is reduced, and the luminous efficiency of the OLED display panel is improved. On the other hand, when the first coupling layer 241 is an organic coupling layer, the second coupling layer 242 is in contact with the encapsulation layer 250. Since the inorganic coupling layer is more stable and denser than the organic coupling layer, the second coupling layer 242 protects the first coupling layer 241 and avoids the problem of thermal decomposition of the organic coupling layer during the encapsulation layer 250 being subjected to a subsequent evaporation process. Therefore, a damage to the OLED caused by the evaporation of the thin film encapsulation layer is prevented, and a stability of the OLED display panel is improved.

Because different colors of light have different wavelengths, in order to obtain the best luminous efficiency, a required thickness of the light coupling layer 240 is also different, and an optimal thickness of the light coupling layer 240 is positively correlated with the wavelength of the light. The first coupling layer 241 mainly functions with the optical microcavity to improve the luminous efficiency of the OLED display panel. The first coupling layer 241 with the same thickness can be formed on the red-light material layer 2331, the green-light material layer 2332, and the blue-light material layer 2333 by one process. By adjusting a thickness of the second coupling layer 242 to adjust the thickness of the light coupling layer 240, the OLED display panel can achieve better luminous efficiency.

The second coupling layer 242 includes the first coupling portion 2421, the second coupling portion 2422, and the third coupling portion 2423. The first coupling portion 2421 is disposed above the red-light material layer 2331. The second coupling portion 2422 is disposed above the green-light material layer 2332. The third coupling portion 2423 is disposed above the blue-light material layer 2333.

In one embodiment, the thickness of the third coupling portion 2423 is D3. The thickness of the first coupling portion 2421 and the thickness of the second coupling portion 2422 are D2. In one embodiment, D3 is set to be a thickness when the OLED display panel achieves the best blue luminous efficiency, and D2 is set to be a thickness when the OLED display panel achieves the best green luminous efficiency, such as D3 ranges from 40 to 60 nanometers, and D2 ranges from 80 to 90 nanometers. In another embodiment, D3 is set to be a thickness when the OLED display panel achieves the best blue luminous efficiency, and D2 is set to be a thickness when the OLED display panel achieves the best red luminous efficiency, such as D3 ranges from 40 to 60 nanometers, and D2 ranges from 120 to 150 nanometers.

The embodiment of the present disclosure improves an overall luminous efficiency of the OLED display panel and improves the display performance of the OLED display panel by setting the second coupling layer 242 having two different thicknesses to meet the best luminous efficiency of the two different lights.

In another embodiment, the thickness of the third coupling portion 2423 and the thickness of the second coupling portion 2422 are D3. The thickness of the first coupling portion 2421 is D1. In one embodiment, D3 is set to be a thickness when the OLED display panel achieves the best blue luminous efficiency, and D1 is set to be a thickness when the OLED display panel achieves the best red luminous efficiency, such as D3 ranges from 40 to 60 nanometers, and D1 ranges from 120 to 150 nanometers. In another embodiment, D3 is set to be a thickness when the OLED display panel achieves the best green luminous efficiency, and D1 is set to be a thickness when the OLED display panel achieves the best red luminous efficiency. Preferably, D3 ranges from 80 to 90 nm, and D1 ranges from 120 to 150 nm.

The embodiment of the present disclosure improves the overall luminous efficiency of the OLED display panel and improves the display performance of the OLED display panel by setting the second coupling layer 242 having two different thicknesses to meet the best luminous efficiency of the two different lights.

In another embodiment, the thickness of the third coupling portion 2423 is D3. The thickness of the second coupling portion 2422 is D2. The thickness of the first coupling portion 2421 is D1. D3 is set to be a thickness of the OLED display panel to achieves the best blue luminous efficiency. D2 is set to be a thickness of the OLED display panel to achieves the best green luminous efficiency. D1 is set to be a thickness of the OLED display panel to achieves the best red luminous efficiency. Preferably, D3 ranges from 40 to 60 nm, D2 ranges from 80 to 90 nm, and D1 ranges from 120 to 150 nm.

The embodiment of the present disclosure improves the overall luminous efficiency of the OLED display panel and improves the display performance of the OLED display panel by setting the second coupling layer 242 having three different thicknesses to meet the best luminous efficiency of the three different lights of red, green, and blue.

In an embodiment, the first coupling portion 2421, the second coupling portion 2422, and the third coupling portion 2423 are all single-layer structures, which are respectively formed by one process.

In another embodiment, the first coupling portion 2421, the second coupling portion 2422, and the third coupling portion 2423 all include a first coupling sub-layer. The first coupling sub-layer is disposed on a side of the first coupling layer away from the luminous functional layer. A thickness of the first coupling sub-layer is set to be a thickness when the OLED display panel achieves the best blue luminous efficiency or a thickness when the OLED display panel achieves the best green luminous efficiency.

The first coupling portion 2421 and the second coupling portion 2422 also include a second coupling sub-layer. The second coupling sub-layer is disposed on a side of the first coupling sub-layer away from the first coupling layer 241. When the thickness of the first coupling sub-layer is set to be a thickness when the OLED display panel achieves the best blue luminous efficiency, a thickness of the second coupling sub-layer is set to be a thickness when the OLED display panel achieves the best green luminous efficiency or a thickness when the OLED display panel achieves the best red luminous efficiency. When the thickness of the first coupling sub-layer is set to be a thickness when the OLED display panel achieves the best green luminous efficiency, the thickness of the second coupling sub-layer is set to be a thickness when the OLED display panel achieves the best red luminous efficiency.

Furthermore, the first coupling portion 2421 also includes a third coupling sub-layer. The third coupling sub-layer is disposed on a side of the second coupling sub-layer away from the first coupling sub-layer. The thickness of the first coupling sub-layer is set to be a thickness when the OLED display panel achieves the best blue luminous efficiency. The thickness of the second coupling sub-layer is set to be a thickness when the OLED display panel achieves the best green luminous efficiency. A thickness of the third coupling sub-layer is set to be a thickness when the OLED display panel achieves the best red luminous efficiency.

Moreover, the present disclosure also provides a manufacturing method of an OLED display panel. Please refer to FIG. 3, which is a flow chart of a manufacturing method of an OLED display panel of an embodiment of the present disclosure. The manufacturing method includes the following.

Figure 3:
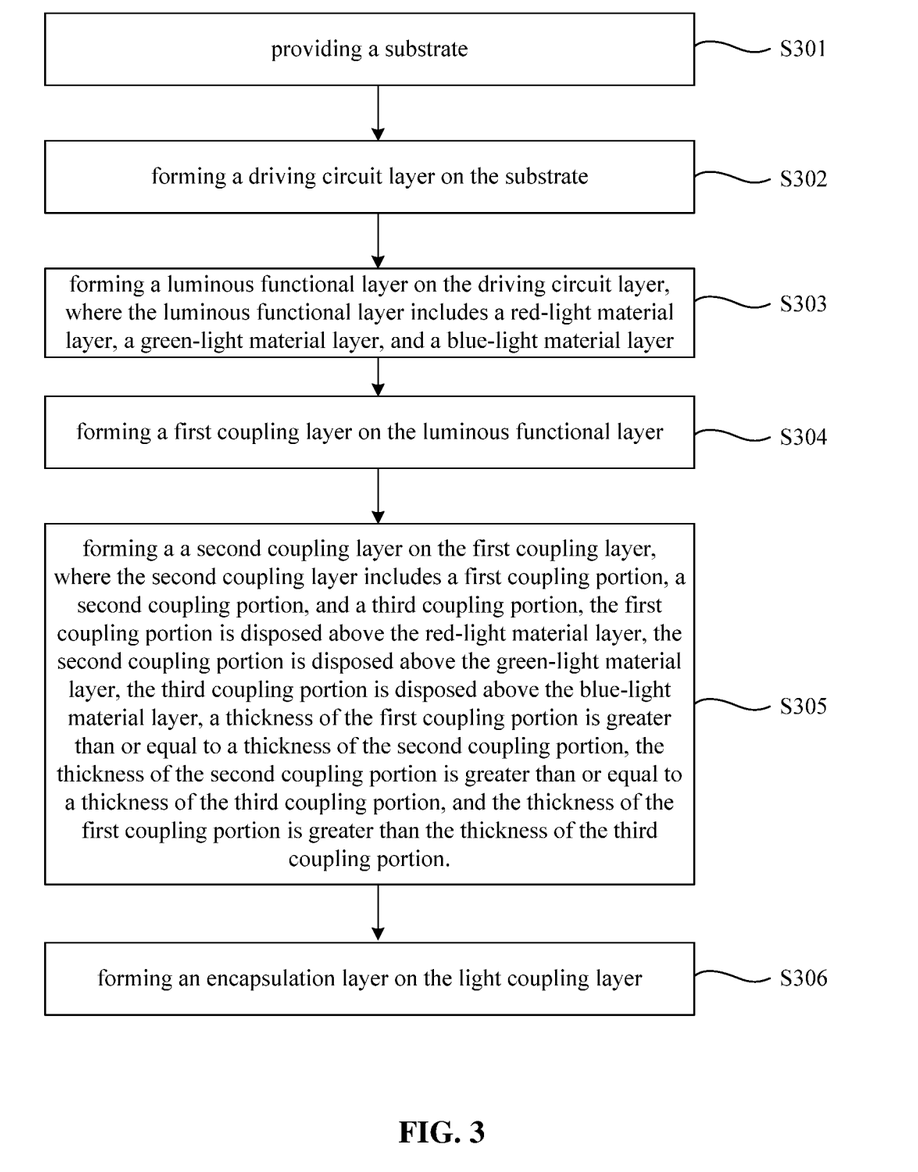
FIG. 3 is a flow chart of a manufacturing method of an OLED display panel of an embodiment of the present disclosure.

In a step S301, a substrate is provided.

In a step S302, a driving circuit layer is formed on the substrate.

In a step S303, a luminous functional layer and a luminous functional layer are formed on the driving circuit layer. The luminous functional layer includes a red-light material layer, a green-light material layer, and a blue-light material layer.

In a step S304, a first coupling layer is formed on the luminous functional layer.

In a step S305, a second coupling layer is formed on the first coupling layer. The second coupling layer includes a first coupling portion, a second coupling portion, and a third coupling portion. The first coupling portion is disposed above the red-light material layer. The second coupling portion is disposed above the green-light material layer. The third coupling portion is disposed above the blue-light material layer. A thickness of the first coupling portion is greater than or equal to a thickness of the second coupling portion. The thickness of the second coupling portion is greater than or equal to a thickness of the third coupling portion. The thickness of the first coupling portion is greater than the thickness of the third coupling portion.

In a step S306, an encapsulation layer is formed on the light coupling layer.

In the manufacturing method of the OLED display panel of the embodiment of the present disclosure, the first coupling layer is formed on the luminous functional layer. The first coupling portion, the second coupling portion, and the third coupling portion are formed first coupling layer and correspond to the red-light material layer, the green-light material layer, and the blue-light material layer, respectively. Also, the thickness of the first coupling portion is greater than or equal to the thickness of the second coupling portion, the thickness of the second coupling portion is greater than or equal to the thickness of the third coupling portion, and the thickness of the first coupling portion is greater than the thickness of the third coupling portion. Therefore, in the OLED display panel, the best luminous efficiency of at least two different lights is achieved at the same time, which improves an overall luminous efficiency of the OLED display panel and improves the display performance of the OLED display panel.

In an embodiment, the step S305 of forming the second coupling layer on the first coupling includes the follows.

A first coupling portion is formed above the red-light material layer and on the first coupling layer.

A second coupling portion is formed above the green-light material layer and on the first coupling layer.

A third coupling portion is formed above the blue-light material layer and on the first coupling layer.

In an embodiment, the step S305 of forming the second coupling layer on the first coupling includes the follows.

A first coupling sub-layer is formed on the first coupling layer and above the red-light material layer, the green-light material layer, and the blue-light material layer.

A second coupling sub-layer is formed on the first coupling sub-layer and above the red-light material layer and the green-light material layer.

Furthermore, the step of forming the second coupling layer on the first coupling layer includes the following.

A third coupling sub-layer is formed above the red-light material layer and on the second coupling sub-layer.

The present disclosure also provides a display device, and the display device includes any OLED display panel of the present disclosure. The OLED display panel includes:

a substrate;

a driving circuit layer disposed on substrate;

a luminous functional layer disposed on the driving circuit layer and including a red-light material layer, a green-light material layer, and a blue-light material layer;

a light coupling layer disposed on the luminous functional layer and including a first coupling layer and a second coupling layer, where the second coupling layer is disposed on a side of the first coupling layer away from the luminous functional layer; and an encapsulation layer disposed on the light coupling layer.

The second coupling layer includes a first coupling portion, a second coupling portion, and a third coupling portion. The first coupling portion is disposed above the red-light material layer. The second coupling portion is disposed above the green-light material layer. The third coupling portion is disposed above the blue-light material layer. A thickness of the first coupling portion is greater than or equal to a thickness of the second coupling portion. The thickness of the second coupling portion is greater than or equal to a thickness of the third coupling portion. The thickness of the first coupling portion is greater than the thickness of the third coupling portion.

The embodiment of the present disclosure provides the display device, and the display device includes the OLED display panel of the present disclosure. The first coupling portion, the second coupling portion, and the third coupling portion are on the luminous functional layer and correspond to the red-light material layer, the green-light material layer, and the blue-light material layer, respectively. There are at least two different thicknesses of the first coupling portion, the second coupling portion, and the third coupling portion. Thus, in the OLED display panel, the best luminous efficiency of at least two different lights is achieved at the same time, which improves an overall luminous efficiency of the OLED display panel and improves the display performance of the OLED display panel.

In one embodiment, the thickness of the first coupling portion ranges from 120 to 150 nanometers.

In one embodiment, the thickness of the second coupling portion ranges from 80 to 90 nanometers.

In one embodiment, the thickness of the second coupling portion ranges from 40 to 60 nanometers.

In an embodiment, a refractive index of the second coupling layer is less than a refractive index of the first coupling layer.

In an embodiment, material of the second coupling layer includes an inorganic material.

In one embodiment, the first coupling portion, the second coupling portion, and the third coupling portion include a first coupling sub-layer. The first coupling sub-layer is disposed on a side of the first coupling layer away from the luminous functional layer. The first coupling portion and second coupling portion also include second coupling sub-layer. The second coupling sub-layer is disposed on a side of the first coupling sub-layer away from the first coupling layer.

In an embodiment, the first coupling portion further includes a third coupling sub-layer, and the third coupling sub-layer is disposed on a side of the second coupling sub-layer away from the first coupling sub-layer.

According to the above embodiments, the following can be known.

The present disclosure provides an OLED display panel and a display device. The OLED display panel includes a substrate, a driving circuit layer, a luminous functional layer, a light coupling layer, and an encapsulation layer. The driving circuit layer is disposed on the substrate. The luminous functional layer is disposed on the driving circuit layer and includes a red-light material layer, a green-light material layer, and a blue-light material layer. The light coupling layer is disposed on the luminous functional layer and includes a first coupling layer and a second coupling layer. The second coupling layer is disposed on a side of the first coupling layer away from the luminous functional layer. The encapsulation layer is disposed on the light coupling layer. The second coupling layer includes a first coupling portion, a second coupling portion, and a third coupling portion. The first coupling portion is disposed above the red-light material layer. The second coupling portion is disposed above the green-light material layer. The third coupling portion is disposed above the blue-light material layer. A thickness of the first coupling portion is greater than or equal to a thickness of the second coupling portion. The thickness of the second coupling portion is greater than or equal to a thickness of the third coupling portion. The thickness of the first coupling portion is greater than the thickness of the third coupling portion. Thus, in the OLED display panel, the best luminous efficiency of at least two different lights is achieved at the same time, which improves an overall luminous efficiency of the OLED display panel and improves a display performance of the OLED display panel.

In summary, although the present disclosure has been disclosed in preferred embodiments as described above, the above preferred embodiments are not intended to limit the present disclosure. Those of ordinary skill in the art can make various changes and modifications without departing from the spirit and scope of the present disclosure. Therefore, the protection scope of the present disclosure is subject to the appended claims.

What is claimed is:

1. An organic light-emitting diode (OLED) display panel, comprising:
   a substrate;
   a driving circuit layer disposed on the substrate;
   a luminous functional layer disposed on the driving circuit layer and comprising a red-light material layer, a green-light material layer, and a blue-light material layer;
   a light coupling layer disposed on the luminous functional layer and comprising a first coupling layer and a second coupling layer, wherein the second coupling layer is disposed on a side of the first coupling layer away from the luminous functional layer; and
   an encapsulation layer disposed on the light coupling layer,
   wherein the second coupling layer comprises a first coupling portion, a second coupling portion, and a third coupling portion, the first coupling portion is disposed above the red-light material layer, the second coupling portion is disposed above the green-light material layer, the third coupling portion is disposed above the blue-light material layer, a thickness of the first coupling portion is greater than or equal to a thickness of the second coupling portion, the thickness of the second coupling portion is greater than or equal to a thickness of the third coupling portion, and the thickness of the first coupling portion is greater than the thickness of the third coupling portion, and
   wherein a refractive index of the second coupling layer is less than a refractive index of the first coupling layer.

2. The OLED display panel as claimed in claim 1, wherein the thickness of the first coupling portion ranges from 120 to 150 nanometers.

3. The OLED display panel as claimed in claim 1, wherein the thickness of the second coupling portion ranges from 80 to 90 nanometers.

4. The OLED display panel as claimed in claim 1, wherein the thickness of the third coupling portion ranges from 40 to 60 nanometers.

5. The OLED display panel as claimed in claim 1, wherein the refractive index of the second coupling layer ranges from 1.3 to 1.8.

6. The OLED display panel as claimed in claim 1, wherein material of the second coupling layer comprises an inorganic material.

7. The OLED display panel as claimed in claim 6, wherein the material of the second coupling layer is selected from a group consisting of lithium fluoride, magnesium fluoride, yttrium fluoride, ytterbium fluoride, calcium fluoride, aluminum fluoride, barium fluoride, sodium fluoride, silicon monoxide, yttrium oxide, aluminum oxide, magnesium oxide, hafnium dioxide, and lead fluoride.

8. The OLED display panel as claimed in claim 1, wherein each of the first coupling portion, the second coupling portion, and the third coupling portion comprise a first coupling sub-layer, and the first coupling sub-layer is disposed on the side of the first coupling layer away from the luminous functional layer; and
   each of the first coupling portion and the second coupling portion further comprise a second coupling sub-layer, and the second coupling sub-layer is disposed on a side of the first coupling sub-layer away from the first coupling layer.

9. The OLED display panel as claimed in claim 8, wherein the first coupling portion further comprises a third coupling sub-layer, and the third coupling sub-layer is disposed on a side of the second coupling sub-layer away from the first coupling sub-layer.

10. A display device, comprising an organic light-emitting diode (OLED) display panel, wherein the OLED display panel comprises:
    a substrate;
    a driving circuit layer disposed on the substrate;
    a luminous functional layer disposed on the driving circuit layer and comprising a red-light material layer, a green-light material layer, and a blue-light material layer;
    a light coupling layer disposed on the luminous functional layer and comprising a first coupling layer and a second coupling layer, wherein the second coupling layer is disposed on a side of the first coupling layer away from the luminous functional layer; and
    an encapsulation layer disposed on the light coupling layer,
    wherein the second coupling layer comprises a first coupling portion, a second coupling portion, and a third coupling portion, the first coupling portion is disposed above the red-light material layer, the second coupling portion is disposed above the green-light material layer, the third coupling portion is disposed above the blue-light material layer, a thickness of the first coupling portion is greater than or equal to a thickness of the second coupling portion, the thickness of the second coupling portion is greater than or equal to a thickness of the third coupling portion, and the thickness of the first coupling portion is greater than the thickness of the third coupling portion, and
    wherein a refractive index of the second coupling layer is less than a refractive index of the first coupling layer.

11. The display device as claimed in claim 10, wherein the thickness of the first coupling portion ranges from 120 to 150 nanometers.

12. The display device as claimed in claim 10, wherein the thickness of the second coupling portion ranges from 80 to 90 nanometers.

13. The display device as claimed in claim 10, wherein the thickness of the third coupling portion ranges from 40 to 60 nanometers.

14. The display device as claimed in claim 10, wherein the refractive index of the second coupling layer ranges from 1.3 to 1.8.

15. The display device as claimed in claim 10, wherein material of the second coupling layer comprises an inorganic material.

16. The display device as claimed in claim 15, wherein the material of the second coupling layer is selected from a group consisting of lithium fluoride, magnesium fluoride, yttrium fluoride, ytterbium fluoride, calcium fluoride, aluminum fluoride, barium fluoride, sodium fluoride, silicon monoxide, yttrium oxide, aluminum oxide, magnesium oxide, hafnium dioxide, and lead fluoride.

17. The display device as claimed in claim 10, wherein each of the first coupling portion, the second coupling portion, and the third coupling portion comprise a first coupling sub-layer, and the first coupling sub-layer is disposed on the side of the first coupling layer away from the luminous functional layer; and each of the first coupling portion and the second coupling portion further comprise a second coupling sub-layer, and the second coupling sub-layer is disposed on a side of the first coupling sub-layer away from the first coupling layer.

18. The display device as claimed in claim 17, wherein the first coupling portion further comprises a third coupling sub-layer, and the third coupling sub-layer is disposed on a side of the second coupling sub-layer away from the first coupling sub-layer.

* * * * *